United States Patent [19]

Hamirani

[11] Patent Number: 5,673,174
[45] Date of Patent: Sep. 30, 1997

[54] SYSTEM PERMITTING THE EXTERNAL REPLACEMENT OF THE CPU AND/OR DRAM SIMMS MICROCHIP BOARDS

[75] Inventor: Babar Hamirani, Fremont, Calif.

[73] Assignee: Nexar Technologies, Inc., Westborough, Mass.

[21] Appl. No.: 409,317

[22] Filed: Mar. 23, 1995

[51] Int. Cl.⁶ .................... G06F 1/16; H05K 7/06
[52] U.S. Cl. ........................... 361/686; 361/683
[58] Field of Search ................ 361/684, 685, 361/686, 683, 679; 364/708.1; G06F 1/16

[56] References Cited

U.S. PATENT DOCUMENTS

| | | | |
|---|---|---|---|
| 4,870,605 | 9/1989 | Vo | 361/684 |
| 4,876,630 | 10/1989 | Dara | 361/413 |
| 4,977,532 | 12/1990 | Borkowicz et al. | 361/683 |
| 4,984,993 | 1/1991 | Neumann et al. | 439/157 |
| 5,238,423 | 8/1993 | Hillis et al. | 439/259 |
| 5,265,328 | 11/1993 | Gorman | 29/829 |
| 5,317,481 | 5/1994 | Hillis et al. | 361/796 |
| 5,460,441 | 10/1995 | Hastings et al. | 361/684 |

FOREIGN PATENT DOCUMENTS 406112673   4/1994   Japan ............................ 361/684

*Primary Examiner*—Leo P. Picard
*Assistant Examiner*—Lynn D. Feild

[57] ABSTRACT

An improved computer chassis and cover assembly that includes an apparatus and method for installation and replacement of the computer CPU or SIMMs chips without removal of the cover. This permits quick and easy upgrading of the computer CPU or SIMMs memory boards as their prices drop or as changes occur. The invention also allows vendors to purchase expensive and price volatile CPU's and SIMMs memory boards on an "as needed" basis, eliminating warehousing of commodities whose prices may drop suddenly.

10 Claims, 8 Drawing Sheets

SYSTEM PERMITTING THE EXTERNAL REPLACEMENT OF THE CPU AND/OR DRAM SIMMS MICROCHIP BOARDS

BACKGROUND OF THE INVENTION a) Field of the Invention

The invention relates in general to personal computers and in particular to personal computers having means for accessing, installing and replacing Motherboard Components such as the Central Processing Unit(CPU) and the Single In-Line Memory Modules(SIMMs) boards (containing the Dynamic Random Access Memory[DRAM]), all without opening the Personal Computer system unit cover or removing other system components.

b) Description of the Related Art

Personal Computer Systems or PC's consist of a system unit or main unit and various other units which connect to the system unit. The system unit generally contains: 1) a power supply, 2) the mother board, mainboard or main circuit board, 3) expansion cards which plug into the motherboard, 4) various disk drives which store binary information for the computer system, 5) interconnecting cables, 6) a Central Processing Unit (CPU) processor or microprocessor which performs the necessary logical calculation for the computer system, and 7) single in-line memory modules (SIMMs) boards.

Computer chassis and cover assemblies have remained virtually unchanged since their introduction in the 1970's. Normally, the majority of components installed on the motherboard are located on one side of the board, called the "component" side. The other side of the board, called the "solder" side, is left unpopulated or clear of components due to tight clearances between the motherboard and the system unit chassis. This architecture has been repeated in various configurations commonly referred to as "Desktop" and "Tower" configurations, since the original PC design in 1981.

The CPU is a component which does not have a stable price, but rather, decreases rapidly throughout the technological and market life of the component. Since CPU price is a significant factor in the total cost of a PC, the cost of the CPU limits the profitability of computer systems. Due to the highly competitive and volatile nature of the PC industry, the CPU price may drop while a dealer still has a large inventory in stock. Consequently, the dealer must now lower the price of the PC to reflect the CPU price drop and thereby remain competitive. The decreased profitability of the computer system must be born jointly by the manufacturer and the distributor/dealer.

Furthermore, since CPU performance and prices erode quickly, end-users desire the ability to upgrade their PC's by replacing the CPU rather than purchasing an entirely new PC. Similarly, SIMMs boards represent a part of the system that are often accessed. As the user encounters programs which require more DRAM to run, the user must add additional SIMMS in the sockets normally provided by the motherboard manufacturer.

Prior to this invention, the replacement of the CPU was a difficult process. The ability of an end-user to upgrade his PC is limited by technical dexterity, knowledge and fear of the complexity of a PC. The cover of the system unit has to be removed and components, (frequently including the motherboard), have to be disconnected and removed just to access the CPU. Once the CPU is reached, removal and reinstallation are difficult, due to the mechanical design of the CPU socket, where reliable electrical connections are assured by dose mechanical tolerances. Oftentimes, special mechanical tools are needed to remove and reinstall a CPU. Removal and replacement of the CPU using heretofore methods was a time consuming process. Also end-users frequently fear the process of CPU replacement due to the complexity of the heretofore process. The difficulty in accessing the CPU for removal and installation has been a major drawback of industry standard PC design.

One known method of improving CPU access is installation of a Zero-insertion-force(ZIF) or Low-insertion-force (LIFF) socket on the motherboard. These sockets include a mechanical mechanism which, when activated, allows the CPU to be easily attached and detached to the motherboard. This is in contrast to normal integrated circuit sockets which require special tools and the application of force to remove and reinstall the CPU. Although ZIF and LIF sockets are and improvement, they are still limited by the fact that the system unit must be disassembled to access the CPU. In fact the only clear advantage of the use of ZIF and LIF sockets is that depending on the design of the system unit, the motherboard may not have to be removed from the system unit chassis for CPU replacement.

Accordingly, it would be desirable to have a means and method for easily accessing the CPU and/or the SIMMs boards without opening the system unit cover. This would allow end-users to easily upgrade their computer system as newer technologies increase the performance of next generation CPUs and as DRAM requirements increase. Also dealers would be able to maintain and update a limited stock of CPUs and SIMMs and install them immediately prior to the sale of the computer system(s) to realize the greatest profit.

SUMMARY OF THE INVENTION

Briefly the present invention comprises means and method for accessing the CPU and/or the SIMMs boards without opening the system unit cover. This is accomplished by (1) moving the location of the CPU and the SIMMs receptacle or socket from the component side of the motherboard to the solder side; and (2) providing an access cover or door which allows the relocated CPU and/or the SIMMs receptacle or socket to be reached without removing the system unit's cover. The location of the CPU or SIMMs access cover or door is not constrained to any particular location and will instead vary, depending on the chassis design and the motherboard location within the system unit.

BRIEF DESCRIPTION OF THE DRAWINGS

The invention may be understood and further advantages and uses thereof more readily apparent, when considered in view of the following detailed description of the exemplary embodiments, taken with the accompanying drawings in which.

DETAILED DESCRIPTION OF THE PREFERRED EMBODIMENTS

Figure 5:
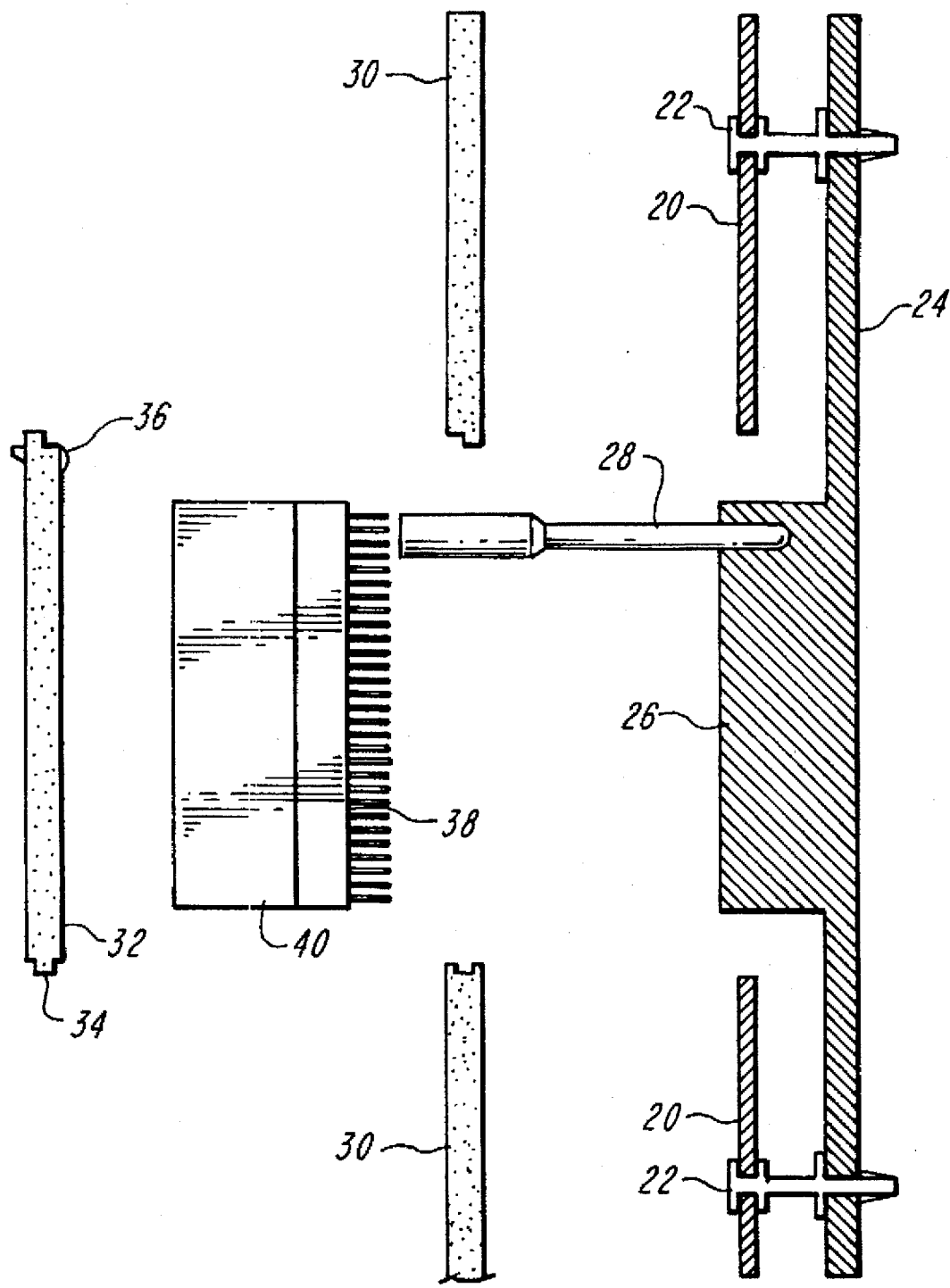
FIG. 5 illustrates a cross-sectional detail view of a system unit tower chassis constructed according to the teachings of the invention.
Figure 6:
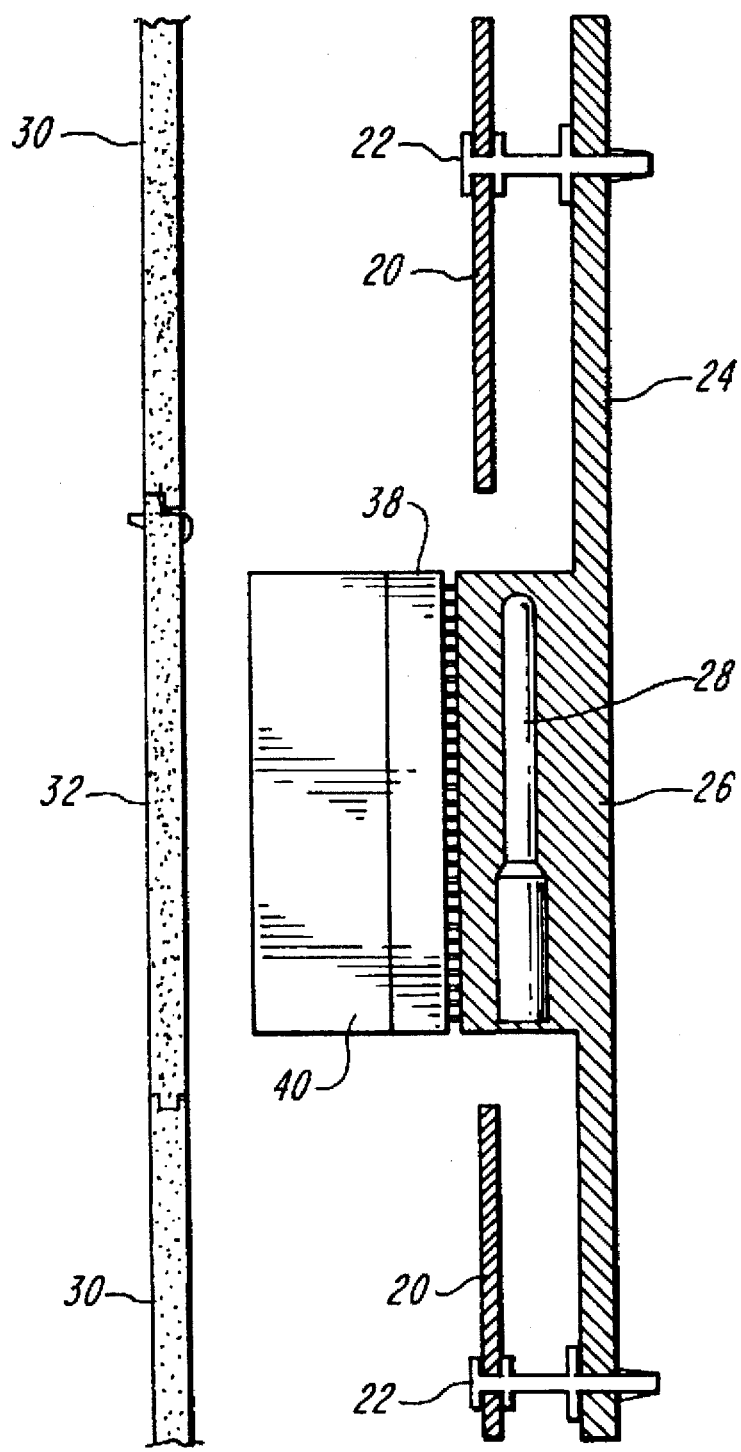
FIG. 6 illustrates a cross sectional detail view of a system unit tower chassis constructed according to the teachings of the invention.
Figure 7:
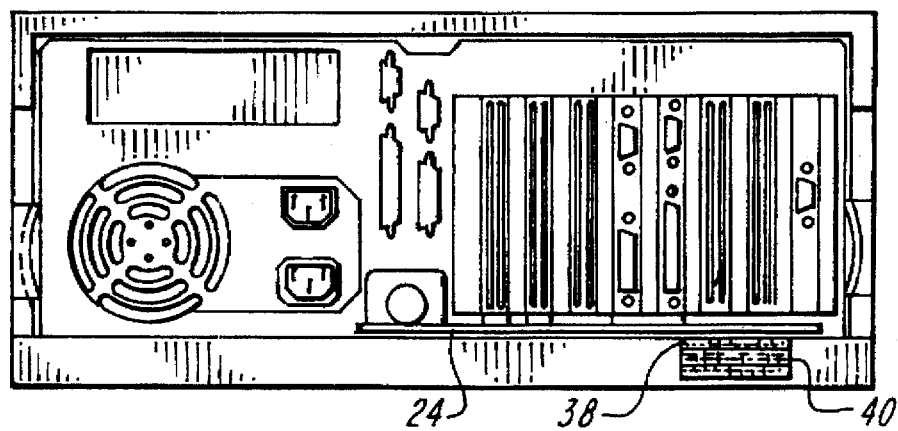
FIG. 7 illustrates a transparent rear view of a system unit desktop chassis constructed according to the teachings of the invention.
Figure 8:
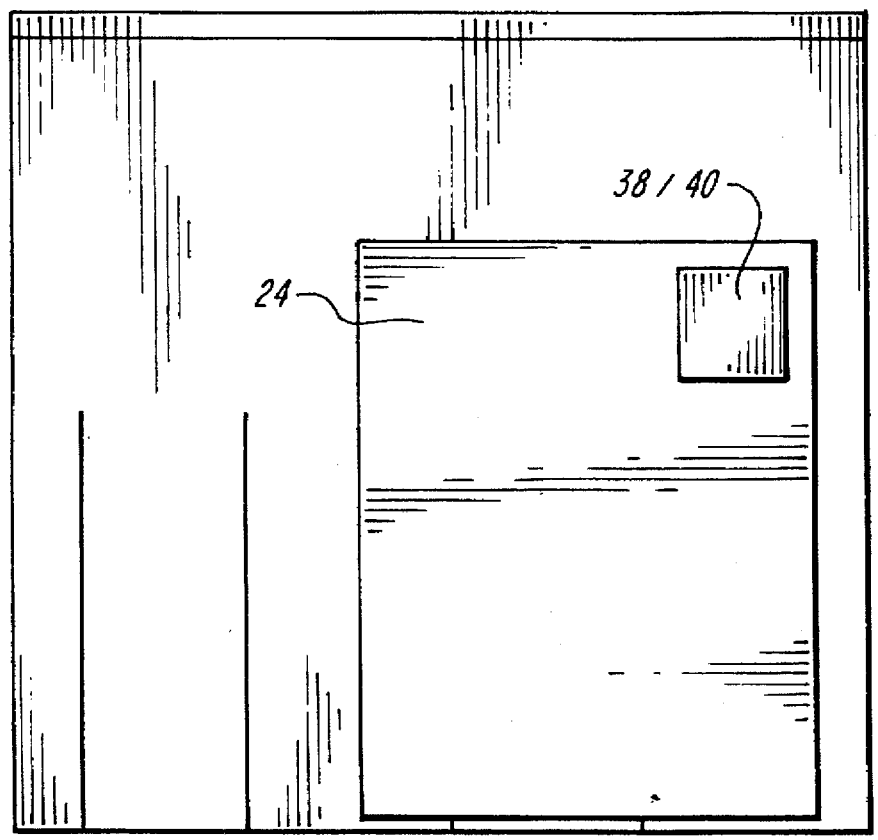
FIG. 8 illustrates a transparent top view of a system unit desktop chassis constructed according to the teachings of the invention.
Figure 11:
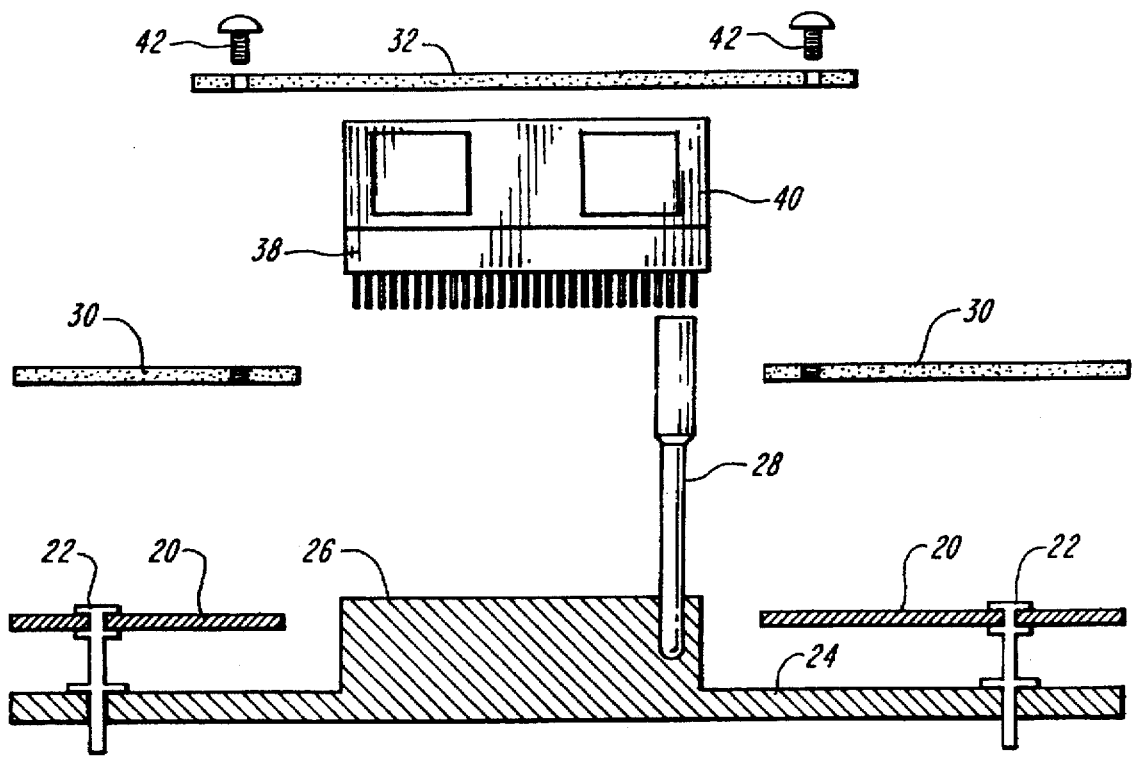
FIG. 11 illustrates a cross sectional detail view of a system unit desktop chassis constructed according to the teachings of the invention.
Figure 12:
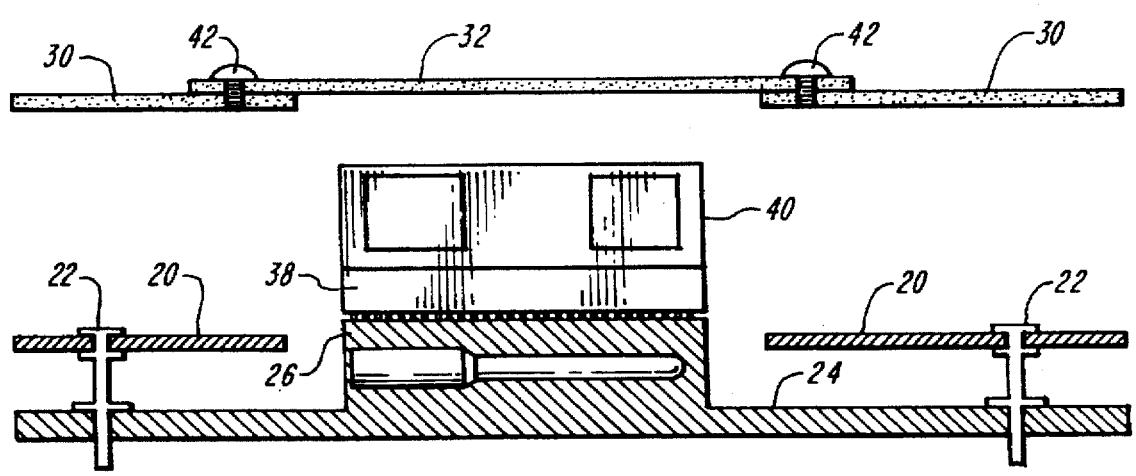
FIG. 12 illustrates a cross-sectional detail view of a system unit desktop chassis with all components installed constructed according to the teachings of the invention.

Referring now to the drawings, and to FIGS. 1–6 in particular, there is shown a computer system which is of the "tower" design constructed according to the teachings of the invention. FIGS. 7–12 illustrate a computer system unit 12 which is of the "desktop" design. Each computer system unit includes chassis 12 and base frame 20(a section of the chassis which supports the motherboard) and cover 30 having side panel 16 and bottom panel 18,. Multiple stand-offs 22 which may be made of suitable plastic or metal fasten Motherboard 24(a Printed Circuit Board comprising the main circuits of the Computer System) to the base frame 20. CPU Socket 26(a component which connects the CPU to the motherboard) is disposed on Motherboard 24, includes Latch 28, the mechanical mechanism which connects and releases the CPU 38 to the Motherboard. Heat sink/fan assembly 40 is disposed so as to provide cooling to the CPU 38. CPU 38 performs the calculations and processing required by the PC. Cover 30 including side panel 16 and bottom panel 18, provides a protective and decorative cover over the chassis 12. Referring now to FIGS. 5 and 11 there is shown Latch 28 in the open position. Referring now to FIGS. 6 and 12 there is shown Latch 28 in the closed position. Referring now to FIGS. 5 and 6 there is shown socket access cover 32 which includes socket access cover locking pins 34 and socket access cover latching mechanism 36 disposed on side panel 16(for the "tower" design) of cover 30. Referring now to FIGS. 11 and 12 there is shown socket access cover 32 disposed on bottom panel 18(for the "desktop" design) of cover 30 by means of socket access cover mounting screws 42 so as to provide access to the CPU 38 without removing cover 30.

Referring now to FIGS. 5 and 11 and according to the teachings of the invention, the system unit chassis is modified to provide a socket access cover including a socket access door. This cover may be joined to the system unit by any conventional fastener means including screws, glue or friction "snap" fasteners and the resulting structure may have any arbitrary shape that is functional. Further, referring now to FIGS. 6 and 12, the system unit chassis is modified to provide necessary clearances for a ZIF, LIF or SIMMs socket, CPU and heat sink/fan combination, all to be installed on the solder side of the motherboard. Also required, are necessary modifications to the system unit chassis to provide sufficient airflow to provide and ensure proper cooling of the CPU.

Figure 2:
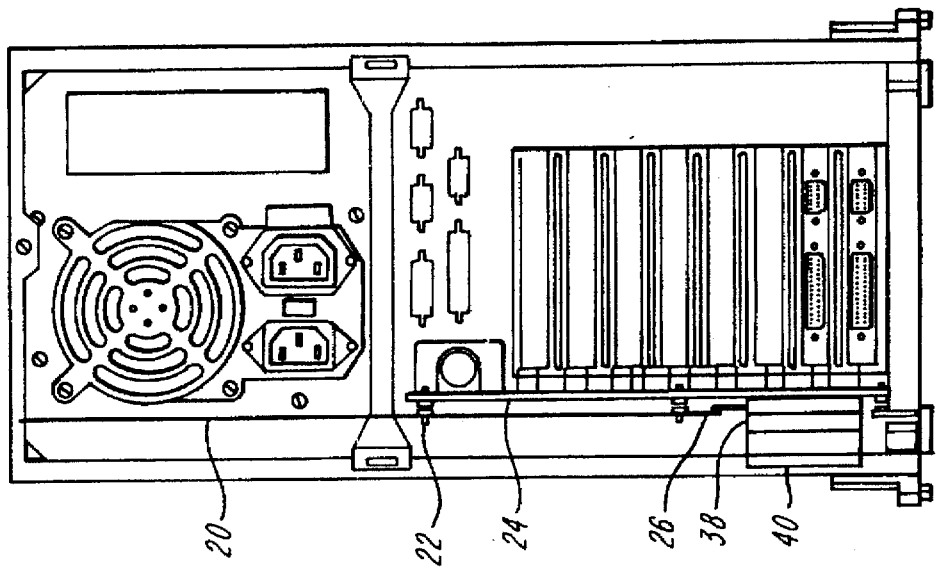
FIG. 2 illustrates a transparent (the entire rear panel is broken away so as to illustrate the interior) rear view of a system unit tower chassis constructed according to the teachings of the invention.
Figure 1:
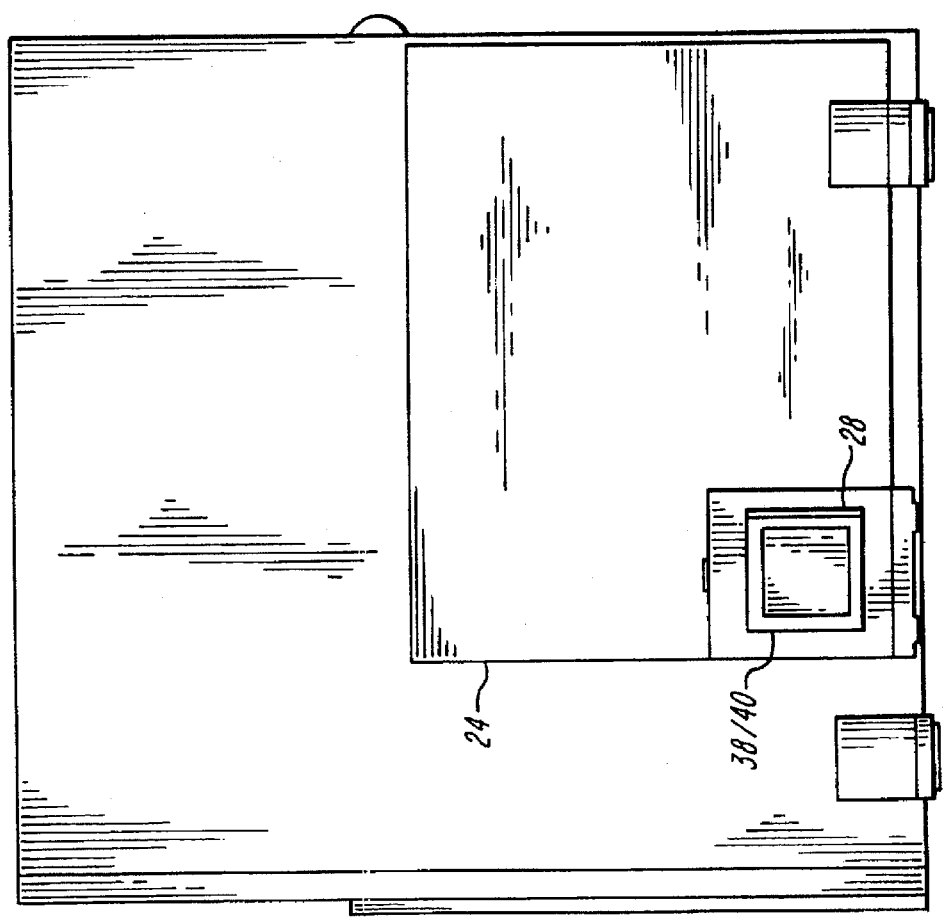
FIG. 1 illustrates a transparent (the entire side panel is broken away so as to illustrate the interior) side view of a system unit tower chassis constructed according to the teachings of the invention.
Figure 3:
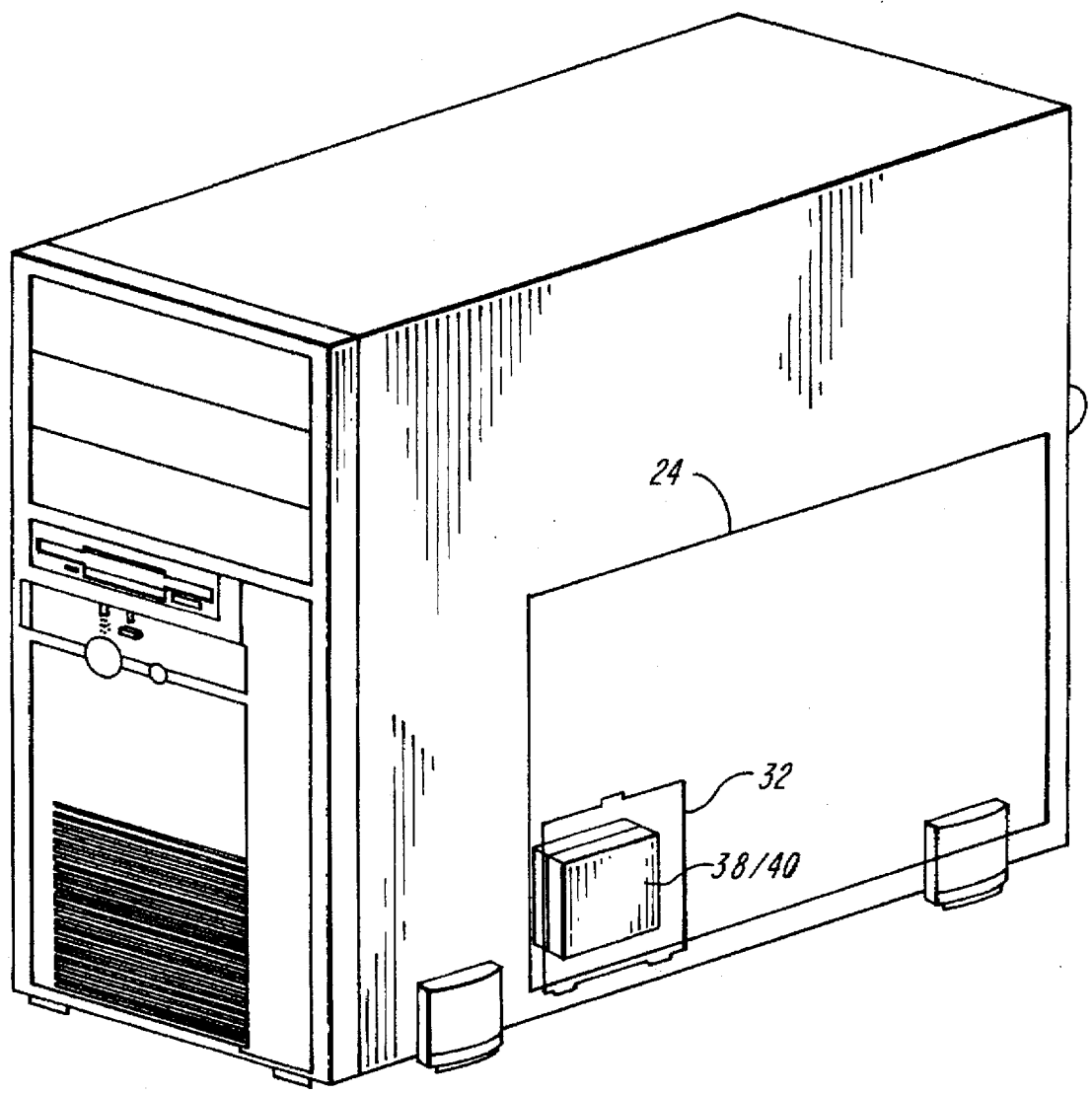
FIG. 3 illustrates a transparent (the entire side panel is again broken away so as to illustrate the interior) perspective view of a system unit tower chassis constructed according to the teachings of the invention.
Figure 4:
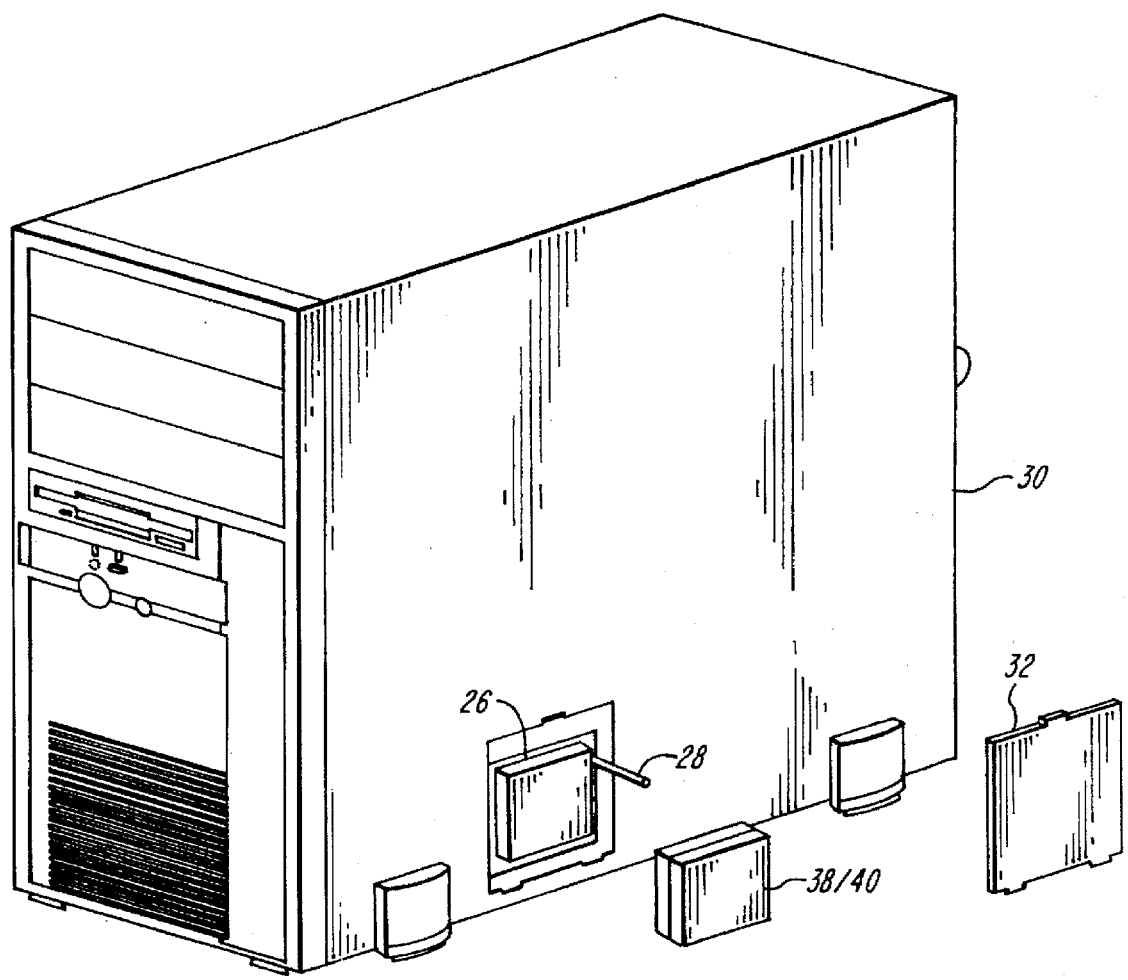
FIG. 4 illustrates an exploded view of a system unit tower chassis constructed according to the teachings of the invention.
Figure 9:
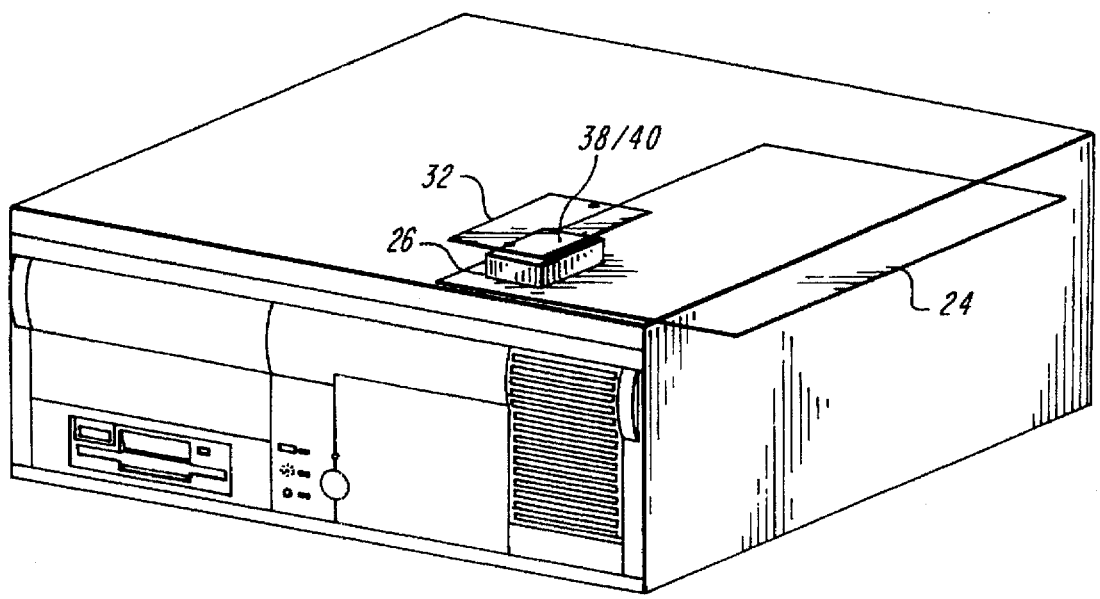
FIG. 9 illustrates a transparent perspective view of a system unit desktop chassis constructed according to the teachings of the invention.
Figure 10:
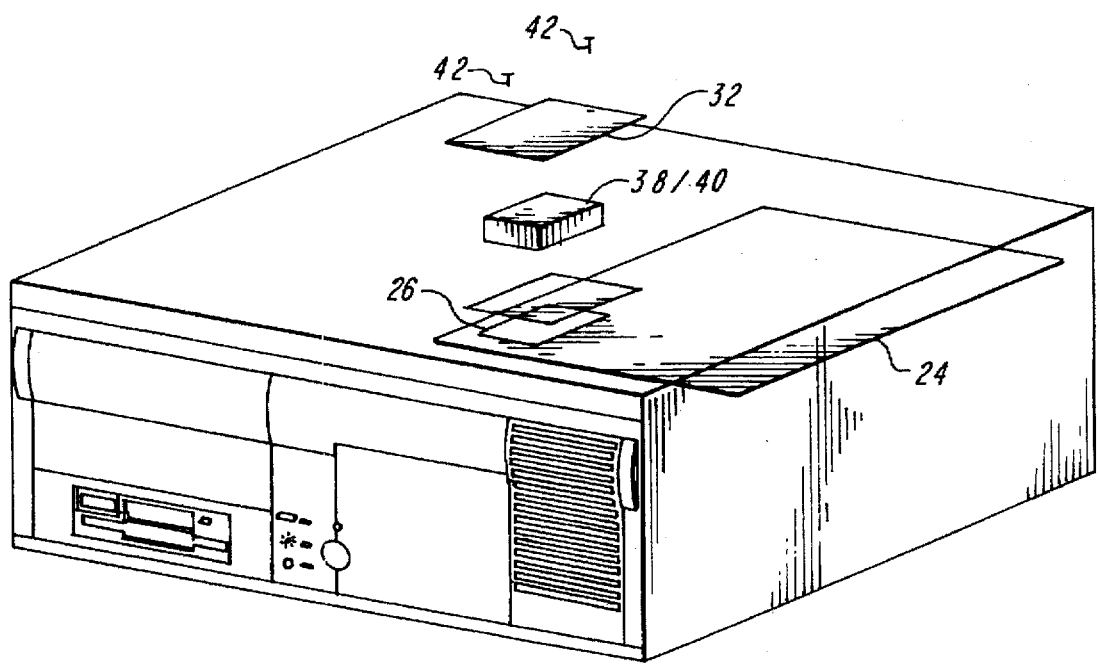
FIG. 10 illustrates an exploded view of a system unit desktop chassis constructed according to the teachings of the invention.

Referring now to FIGS. 3 and 9, the teachings of the invention further include modifying the motherboard to move the CPU socket to the solder side of the motherboard, and disposing an appropriate ZIF or LIF socket on the solder side of the motherboard. The selection of any particular design of CPU socket is based upon its ability to accept CPUs from different manufactures with differing levels of technological sophistication. Referring now to FIGS. 1 and 2 and FIGS. 7 and 8, the relocation of the CPU necessitates moving the supply point for the cooling fan lead to the solder side of the motherboard. Since most motherboard designs require jumpers and switches to configure the motherboard for the CPU, all jumpers and switches must be moved to the solder side of the motherboard. Solder traces are rerouted to provide adequate and appropriate connections to all rearranged components. Other support components such as decoupling capacitors are moved and rerouted as necessary to ensure effective operation of the motherboard.

For one preferred embodiment of the invention(FIGS. 1–6), the width of the chassis is increased to provide sufficient clearance for the installation of the socket, CPU and heatsink on those PCs known in the art as having the "Tower" architecture. For those P/Cs having "Desktop" architecture another embodiment of the invention(FIGS. 7–12) increases the height of the chassis to provide sufficient clearance for the installation of the socket, CPU and heatsink. For the "tower" embodiment the socket access cover is disposed on the side of the chassis allowing access to the CPU from the side. For the "desktop" embodiment the socket access cover is disposed on the underside of the chassis allowing access to the CPU when the system unit is turned upside down.

This invention provides a number of clear and distinct advantages. A PC equipped with a socket access cover and motherboard modified as set forth herein will benefit from flexibility, upgrade ability, interchange ability and increased product lifetime.

PC systems with the socket access cover benefit from the flexibility since the CPU or SIMMs can be selected at the time of sale to match system performance requirements. A single PC constructed according to the teachings of the invention can support a broad range of applications depending on the selected CPU and available DRAM. Computer retailers need only stock a few PC system units. Prior to sale, the retailer can open the access cover and install the desired CPU and SIMMs. By placing the appropriate CPU and SIMMs in the desired system unit at the time of sale, the retailer has the flexibility to sell PCs directed toward different markets while maintaining a minimum necessary inventory of CPUs. Since CPUs and frequently, SIMMs need only be purchased and installed when the PC is sold, the retailer can keep his cost minimal while maintaining a flexible inventory to quickly respond to market changes.

PC systems with the CPU access cover constructed according to the teachings of the invention also benefit from upgrade ability. End-users, technicians and dealers can quickly and easily remove and replace the CPU or add to existing DRAM without concern for the additional steps necessary to disassemble the system unit. Opening the system unit is perceived to be a difficult and complex task by end-users. A significant part of the cost of upgrading a PC is spent on labor charges for performing such upgrades. The present invention will simplify the task of upgrading the CPU or adding DRAM to a point where the end-user can be confident of his ability to perform the upgrade, saving on labor cost.

Interchangability is a benefit of this design. Recently, a number of vendors have entered the CPU market. As competition among them intensifies, the end user or dealer can choose a CPU based on price and performance, rather than being limited to a particular CPU manufacturer by the CPU socket layout and placement. Similarly, numerous manufacturers offer SIMMs boards. The end user may purchase additional DRAM SIMMs boards from several suppliers at different times as his needs change.

Increased product lifetime for the system unit is an additional benefit. CPU speed will soon reach 150 MHz and beyond. The industry is standardizing on 3.3 volt architecture, which is replacing the previous 5 volt architecture. This new architecture is expected to predominate the CPU market in the foreseeable future. However, rapidly changing technology and competition in the industry will render CPUs obsolete quicker than ever before. When new CPU designs are created, manufactures tend to design CPUs in different pin configurations including backwards—compatible configurations which are compatible with older CPUs. Thus if the CPU socket is selected to accommodate recent and expected future designs, a PC will be able to benefit from CPU upgrades for several generations rather than becoming obsolete within a single generation (as with current technology). Therefore this invention will increase the lifetime of a system unit.

I claim:

1. A computer having means for external replacement of circuit boards, comprising:
   a) a chassis having a motherboard disposed thereon;
   b) an external chassis cover disposed over said chassis;
   c) at least one primed circuit board disposed in electrical communication with said motherboard;
   d) said motherboard having a component side and a solder side and wherein said at least one printed circuit board is disposed on said solder side of said motherboard; and
   e) said external chassis cover having an access opening proximate said at least one printed circuit board on the solder side of said motherboard, said access opening being sized to permit access to said at least one printed circuit board.

2. The computer having means for external replacement of circuit boards of claim 1, wherein said external manipulation of said at least one printed circuit board includes insertion, removal and replacement of said at least one printed circuit board.

3. The computer having means for external replacement of circuit boards of claim 1 wherein said motherboard further includes a connector for supplying electrical power and ground connections to said at least one printed circuit board.

4. The computer having means for external replacement of circuit boards of claim 3 wherein said connector is the low insertion force type having a mechanical latching mechanism.

5. The computer having means for external replacement of circuit boards of claim 4 wherein said chassis is located within said cover with sufficient clearance for said low insertion force connector, said mechanical latching system and said at least one printed circuit board that has been previously inserted.

6. The computer having means for external replacement of circuit boards of claim 5 wherein said access opening disposed proximate said at least one printed circuit board, is sized so as to permit access to both said at least one printed circuit board and said mechanical latching system.

7. The computer having means for external replacement of circuit boards of claim 6 wherein said cover further includes a second cover disposed over said access opening.

8. The computer having means for external replacement of circuit boards of claim 7 wherein said second cover is of the quick release type.

9. The computer having means for external replacement of circuit boards of claim 8 wherein said printed circuit board has a computer processing unit (CPU) disposed thereon.

10. The computer having means for external replacement of circuit boards of claim 8 wherein said printed circuit board has a single in-line memory module(SIMM) disposed thereon.

* * * * *